United States Patent
Kim et al.

(10) Patent No.: US 9,881,678 B2
(45) Date of Patent: *Jan. 30, 2018

(54) FAST SOFT DATA BY DETECTING LEAKAGE CURRENT AND SENSING TIME

(71) Applicant: SEAGATE TECHNOLOGY LLC, Cupertino, CA (US)

(72) Inventors: Young Pil Kim, Eden Prairie, MN (US); Antoine Khoueir, Edina, MN (US); Namoh Hwang, Seoul (KR)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/411,040

(22) Filed: Jan. 20, 2017

(65) Prior Publication Data

US 2017/0133098 A1    May 11, 2017

Related U.S. Application Data

(63) Continuation of application No. 14/874,257, filed on Oct. 2, 2015, now Pat. No. 9,589,655.

(51) Int. Cl.
*G11C 16/04* (2006.01)
*G11C 16/26* (2006.01)
(Continued)

(52) U.S. Cl.
CPC ............ *G11C 16/26* (2013.01); *G11C 16/32* (2013.01); *G11C 16/3418* (2013.01);
(Continued)

(58) Field of Classification Search
CPC ......... G11C 16/26; G11C 16/32; G11C 16/34; G11C 16/3418; G11C 16/3459; G11C 11/5642; G11C 29/00; G11C 16/3427
(Continued)

(56) References Cited

U.S. PATENT DOCUMENTS 7,342,840 B2   3/2008  Tran
8,953,384 B2   2/2015  Chan et al.
(Continued)

OTHER PUBLICATIONS

Zhao, K. et al., "LDPC-in-SSD: Making Advanced Error Correction Codes Work Effectively in Solid State Drives", USENIX Association, 11th USENIX Conference on File and Storage Technologies (FAST '13) pp. 243-256.

*Primary Examiner* — Gene Auduong
(74) *Attorney, Agent, or Firm* — Holland & Hart LLP

(57) ABSTRACT

Systems and methods for low latency acquisition of soft data from a memory cell based on a sensing time and/or a leakage current are described. In one embodiment, the systems and methods may include applying a first read voltage to a word line of a page of memory cells selected by a processor of a flash memory device for a read operation, applying a pass voltage to word lines associated with one or more different pages of memory cells of the memory block, upon applying the first read voltage sensing whether a bit line of a memory cell in the selected page conducts, measuring a side effect associated with sensing whether the bit line of the memory cell in the selected page conducts, and assigning a LLR value to the memory cell as a soft LDPC input based at least in part on the measured side effect.

20 Claims, 9 Drawing Sheets

(51) Int. Cl.
  *G11C 16/32*   (2006.01)
  *G11C 29/50*   (2006.01)
  *G11C 29/00*   (2006.01)
  *G11C 29/02*   (2006.01)
  *G11C 16/34*   (2006.01)
  *G11C 29/28*   (2006.01)
  *G11C 29/42*   (2006.01)
  *G11C 29/26*   (2006.01)
  *G11C 29/12*   (2006.01)

(52) U.S. Cl.
  CPC .......... *G11C 16/3459* (2013.01); *G11C 29/00* (2013.01); *G11C 29/025* (2013.01); *G11C 29/50012* (2013.01); *G11C 29/26* (2013.01); *G11C 29/28* (2013.01); *G11C 29/42* (2013.01); *G11C 2029/1204* (2013.01); *G11C 2029/5006* (2013.01)

(58) Field of Classification Search
  USPC ............ 365/185.03, 185.09, 185.18, 185.17, 365/185.19
  See application file for complete search history.

(56) References Cited

U.S. PATENT DOCUMENTS

| | | | |
|---|---|---|---|
| 9,589,655 B1* | 3/2017 | Kim | ........................ G11C 16/26 |
| 2009/0323412 A1 | 12/2009 | Mokhlesi et al. | |
| 2012/0166913 A1 | 6/2012 | Alrod et al. | |
| 2013/0163330 A1 | 6/2013 | Sharon | |
| 2013/0308381 A1 | 11/2013 | Alrod et al. | |
| 2015/0043281 A1 | 2/2015 | Hemink et al. | |

* cited by examiner

FAST SOFT DATA BY DETECTING LEAKAGE CURRENT AND SENSING TIME

RELATED APPLICATION

This application is a continuation of U.S. patent application Ser. No. 14/874,257, filed on 2 Oct. 2015 and entitled FAST SOFT DATA BY DETECTING LEAKAGE CURRENT AND SENSING TIME, now U.S. Pat. No. 9,589,655, issued on 7 Mar. 2017, the disclosure of which is incorporated in its entirety by this reference.

SUMMARY

The disclosure herein includes methods and systems for reducing the latency of acquiring soft data from a memory cell based at least in part on a sensing time and/or a leakage current measured while reading the memory cell. In some embodiments, the present systems and methods may perform a read operation in relation to a memory cell of a flash memory storage device.

In one embodiment, the storage device may include a sensing amplifier and a processor. In some cases, the processor includes and/or is part of a storage controller of the storage device. In one example, the page of memory cells may be selected by the processor for a read operation. In some cases, the sensing amplifier may apply a first read voltage to a word line of a page of memory cells. In some embodiments, the sensing amplifier may apply a pass voltage to word lines associated with one or more different pages of memory cells. Upon applying the first read voltage, the sensing amplifier may sense whether a bit line of a memory cell in the selected page conducts. In one configuration, the sensing amplifier may measure a side effect associated with sensing whether the bit line of the memory cell in the selected page conducts. The side effect may include measuring a time it takes to sense whether the bit line is conducting and/or measuring a leakage current associated with sensing whether the bit line conducts with the read voltage applied. In some embodiments, the sense amplifier may include a clock counter. The sense amplifier may use the clock counter to measure the sensing time.

In one configuration, the processor may assign a log likelihood ratio (LLR) value to the memory cell as a soft low density parity check (LDPC) input based at least in part on the measured side effect. In some embodiments, the LLR value may be used as a soft LDPC input to an error correcting code (ECC) engine to decode the data stored in the memory cells. Upon determining the bit line of the memory cell in the selected page conducts, the sensing amplifier may identify the memory cell as storing a logical 1. On the other hand, upon determining the bit line of the memory cell in the selected page does not conduct, the sensing amplifier may identify the memory cell as storing a logical 0.

In one embodiment, the sense amplifier may send to the processor first data related to whether the bit line of the memory cell conducts and second data related to the measured side effect. In one embodiment, the measured side effect comprises a leakage current level. Upon determining the first data indicates the memory cell stores a logical 0, the processor may analyze the leakage current level from the second data to determine whether the leakage current level indicates the memory cell stores a strong logical 0 or a weak logical 0. In some cases, the processor may compare the leakage current level to a predetermined leakage threshold. Upon determining the leakage current level satisfies the predetermined leakage threshold, the processor may assign a strong logical 0 LLR value to the memory cell. Upon determining the leakage current level fails to satisfy the predetermined leakage threshold, the processor may assign a weak logical 0 LLR value to the memory cell.

In one embodiment, the measured side effect comprises a sensing time. The sensing time may be based at least in part on the time period it takes for the sense amplifier to determine whether the memory cell in the selected page conducts. Upon determining the first data indicates the memory cell stores a logical 1, the processor to analyze the sensing time from the second data to determine whether the sensing time indicates the memory cell stores a strong logical 1 or a weak logical 1. In some cases, the processor may compare the sensing time to a predetermined timing threshold. Upon determining the sensing time satisfies the predetermined timing threshold, the processor may assign a strong logical 1 LLR value to the memory cell. Upon determining the sensing time fails to satisfy the predetermined timing threshold, the processor may assign a weak logical 1 LLR value to the memory cell.

In some embodiments, the sense amplifier may bypass applying a second and/or any subsequent read voltage to the word line of the selected page in relation to applying the first read voltage to determine whether the memory cell in the selected page conducts.

A method for reducing the latency of acquiring soft data from a memory cell based at least in part on a sensing time and/or a leakage current measured while reading the memory cell is described. In one embodiment, the method may include applying a first read voltage to a word line of a page of memory cells selected by a processor of a flash memory device for a read operation. The method may include applying a pass voltage to word lines associated with one or more different pages of memory cells of the memory block and upon applying the first read voltage, sensing whether a bit line of a memory cell in the selected page conducts. The method may include measuring a side effect associated with sensing whether the bit line of the memory cell in the selected page conducts and assigning a LLR value to the memory cell as a soft LDPC input based at least in part on the measured side effect.

An apparatus for reducing the latency of acquiring soft data from a memory cell based at least in part on a sensing time and/or a leakage current measured while reading the memory cell is also described. In one embodiment, the apparatus may include a processor, memory in electronic communication with the processor, and instructions stored in the memory, the instructions being executable by the processor to perform the steps of applying a first read voltage to a word line of a page of memory cells selected by a processor of a flash memory device for a read operation. The processor may perform the steps of applying a pass voltage to word lines associated with one or more different pages of memory cells of the memory block and upon applying the first read voltage, sensing whether a bit line of a memory cell in the selected page conducts. The processor may perform the steps of measuring a side effect associated with sensing whether the bit line of the memory cell in the selected page conducts and assigning a LLR value to the memory cell as a soft LDPC input based at least in part on the measured side effect.

The foregoing has outlined rather broadly the features and technical advantages of examples according to this disclosure so that the following detailed description may be better understood. Additional features and advantages will be described below. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein—including their organization and method of operation—together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following a first reference label with a dash and a second label that may distinguish among the similar components. However, features discussed for various components—including those having a dash and a second reference label—apply to other similar components. If only the first reference label is used in the specification, the description is applicable to any one of the similar components having the same first reference label irrespective of the second reference label.

DETAILED DESCRIPTION

Figure 1:
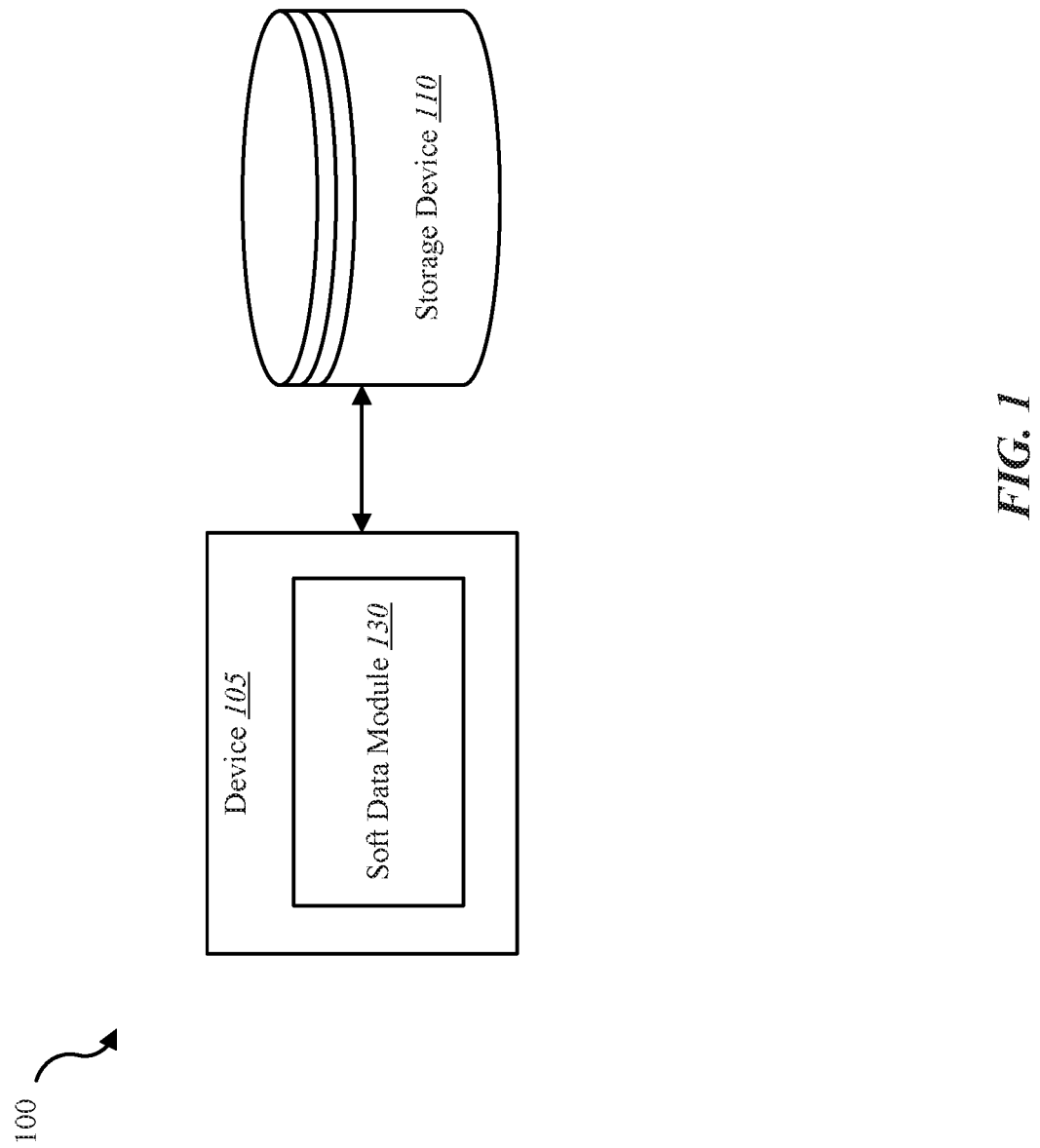
FIG. 1 is a block diagram of an example of a system in accordance with various embodiments.

The following relates generally to reducing the latency of acquiring soft data from a memory cell based at least in part on a sensing time and/or a leakage current measured while reading the memory cell. In one embodiment, the systems and methods apply a single read voltage to read a memory cell instead of the typical two or more different read voltages used to read a memory cell in a conventional read operation.

A typical read of a memory cell of a flash memory device may include a sense amplifier applying two or more read voltages to the memory cell to determine a logical value stored by the memory cell. For example, a sense amplifier may perform multiple read operations using a different read voltage for each read operation. A memory cell may be charged to a predetermined voltage to store a logical 0, while a memory cell may be void or cleared of a charge to store a logical 1. When a read voltage is applied to the bit line of a memory cell, the memory cell with a charge (logical 0) will not conduct unless the read voltage exceeds the voltage charge stored in the memory cell. On the other hand, a memory cell void of charge (logical 1) will conduct for any read voltage applied. Accordingly, a conducting bit line indicates a logical 1 and a non-conducting bit line indicates a logical 0.

As an example, the sense amplifier may apply VR1 for the first read, VR2 for the second read, and VR3 for the third read, where VR2 is a higher voltage than VR1, and VR3 is a higher voltage than VR1 and VR2. Accordingly, the sense amplifier may determine what value is stored by the memory cell. On each pass, the sense amplifier may determine whether a bit line of the memory cell conducts. If the sense amplifier determines the bit line conducts upon applying a read voltage, then the read result is assigned a logical 1. If the sense amplifier determines the bit line does not conduct upon applying a read voltage, then the read result is assigned a logical 0. Thus, if the read result is 111, indicating the bit line conducts upon applying each read voltage VR1, VR2, and VR3, then the sense amplifier determines the memory cell stores a strong logical 1. If the read result is 011, indicating the bit line did not conduct at VR1, but did conduct for VR2 and VR3, then the sense amplifier determines the memory cell stores a weak logical 1. If the read result is 001, indicating the bit line did not conduct at VR1 or VR2, but did conduct at VR3, then the sense amplifier determines the memory cell stores a weak logical 0. If the read result is 000, indicating the bit line did not conduct at VR1, VR2, or VR3, then the sense amplifier determines the memory cell stores a strong logical 0. Accordingly, a Log-Likelihood Ratio (LLR) value may be assigned to the memory cell based on the identified logical value stored in the memory cell. For example, a strong logical 1 may be assigned a LLR value of (−10), a weak logical 1 may be assigned a LLR value of (−5), a weak logical 0 may be assigned a LLR value of (+5), and a strong logical 0 may be assigned a LLR value of (+10). The assigned LLR value of each measured memory cell may be used as an input to a soft low density parity check (LDPC) error correcting code (ECC) engine to decode the data stored in the memory cells. In some cases, the memory cell may store a single bit such as each single-level cell (SLC) of a flash memory device. Thus, a read operation of the present systems and methods may apply a single read voltage to acquire a LLR value instead of applying two or more different read voltages as is done in a conventional read operation.

Additionally or alternatively, a memory cell may store two or more bits such as multiple-level cell (MLC), triple-level cell (TLC), and/or quad-level cell (QLC) memory cells. An MLC memory cell may store two-bit values and thus store one of four states 00, 01, 10, and 11. Each of the four states may be assigned a threshold voltage. Likewise, a TLC memory cell may store three-bit values and thus store one of eight states 000, 001, 010, 011, 100, 101, 110, and 111. Similarly, a QLC memory cell may store four-bit values and thus store one of sixteen states. In some cases, the methods and systems described herein may apply equally to MLC, TLC, and/or QLC memory cells as they do to SLC memory cells.

FIG. 1 is a block diagram illustrating one embodiment of an environment 100 in which the present systems and methods may be implemented. The environment may include device 105 and storage device 110. The storage device 110 may include any combination of hard disk drives, solid state drives, and hybrid drives that include both hard disk and solid state drives. The storage device 110 may include a volatile cache (e.g., disk buffer, static random access memory (RAM), dynamic RAM, etc.). The volatile cache may hold data temporarily such as new data to be stored on the storage device 110 and/or data already stored at a first storage location of storage device 110 being transferred to a second storage location.

In some embodiments, the systems and methods described herein may be performed on a single device (e.g., device 105). In some cases, the methods described herein may be performed on multiple storage devices or a network of storage devices. Examples of device 105 include a storage server, a storage enclosure, a storage controller (e.g., storage controller of storage device 110), storage drives in a distributed storage system, storage drives on a cloud storage system, storage devices on personal computing devices, storage devices on a server, etc. In some configurations, device 105 may include a soft data module 130. In one example, the device 105 may be coupled to storage device 110. In some cases, device 105 and storage device 110 may be in the same enclosure (e.g., a hard disk drive, solid state drive, hybrid drive, etc.). In some cases, device 105 may be a component of a host (e.g., operating system, host hardware system, etc.) of storage device 110.

In one embodiment, device 105 may be a computing device with one or more processors, memory, and/or one or more storage devices. In some cases, device 105 may include a wireless storage device. In some embodiments, device 105 may include a cloud drive for a home or office setting. In one embodiment, device 105 may include a network device such as a switch, router, access point, etc. In one example, device 105 may be operable to receive data streams, store and/or process data, and/or transmit data from, to, or in conjunction with one or more local and/or remote computing devices.

The device 105 may include a database. In some cases, the database may be internal to device 105. For example, storage device 110 may include a database. Additionally, or alternatively, the database may include a connection to a wired and/or a wireless database. Additionally, as described in further detail herein, software and/or firmware (e.g., stored in memory) may be executed on a processor of device 105. Such software and/or firmware executed on the processor may be operable to cause the device 105 to monitor, process, summarize, present, and/or send a signal associated with the operations described herein.

In some embodiments, storage device 110 may connect to device 105 via one or more networks. Examples of networks include cloud networks, local area networks (LAN), wide area networks (WAN), virtual private networks (VPN), a personal area network, near-field communication (NFC), a telecommunications network, wireless networks (using 802.11, for example), and/or cellular networks (using 3G and/or LTE, for example), etc. In some configurations, the network may include the Internet and/or an intranet. The device 105 may receive and/or send signals over a network via a wireless communication link. In some embodiments, a user may access the functions of device 105 via a local computing device, remote computing device, and/or network device. For example, in some embodiments, device 105 may include an application that interfaces with a user. In some cases, device 105 may include an application that interfaces with one or more functions of a network device, remote computing device, and/or local computing device.

Figure 2:
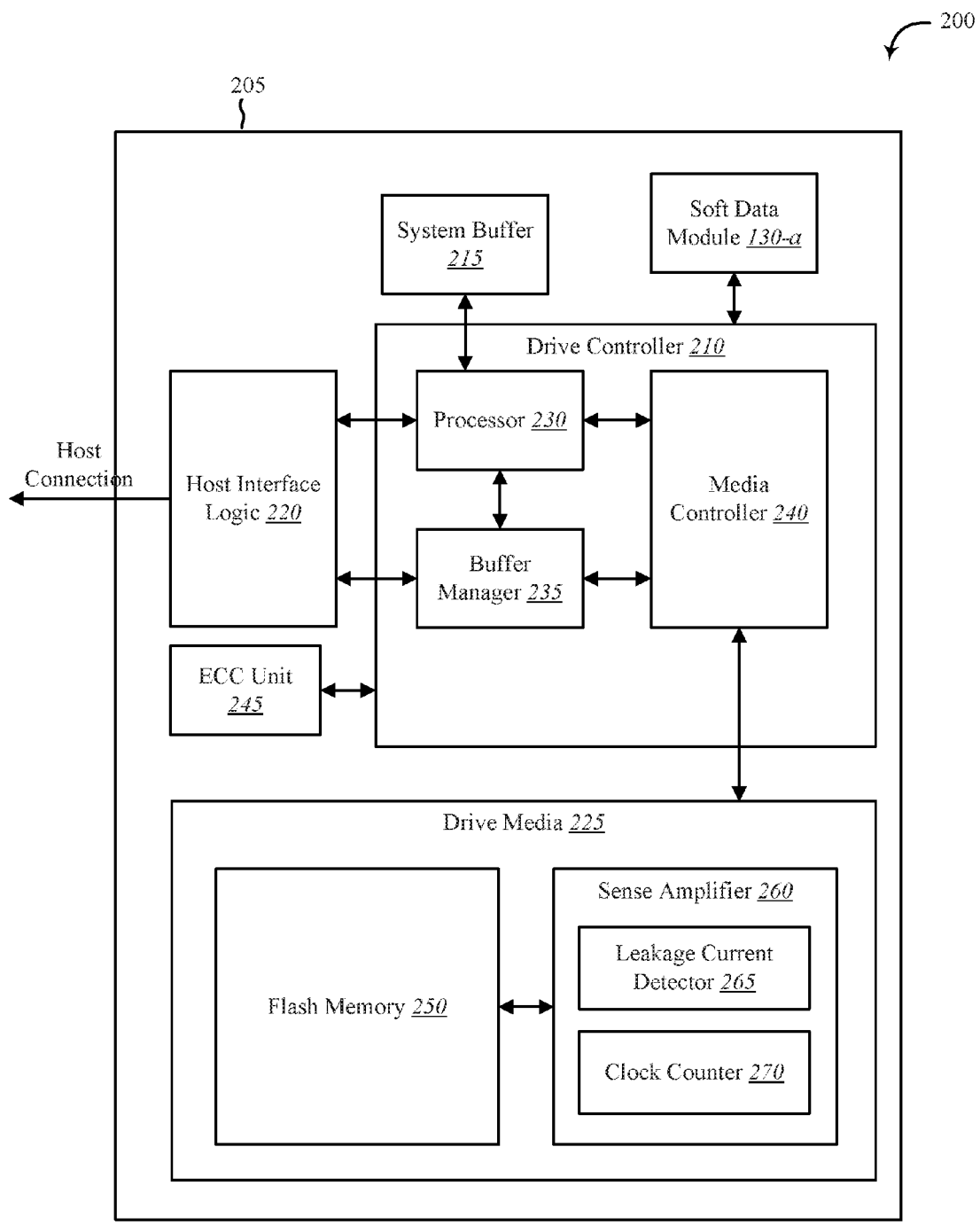
FIG. 2 shows a block diagram of a device in accordance with various aspects of this disclosure.

FIG. 2 shows a block diagram 200 of an apparatus 205 for use in electronic communication, in accordance with various aspects of this disclosure. The apparatus 205 may be an example of one or more aspects of device 105 and/or 110 described with reference to FIG. 1. The apparatus 205 may include a drive controller 210, drive buffer 215, host interface logic 220, drive media 225, and soft data module 130-a. Each of these components may be in communication with each other and/or other components directly and/or indirectly.

One or more of the components of the apparatus 205, individually or collectively, may be implemented using one or more application-specific integrated circuits (ASICs) adapted to perform some or all of the applicable functions in hardware. Alternatively, the functions may be performed by one or more other processing units (or cores), on one or more integrated circuits. In other examples, other types of integrated circuits may be used (e.g., Structured/Platform ASICs, Field Programmable Gate Arrays (FPGAs), and other Semi-Custom ICs), which may be programmed in any manner known in the art. The functions of each module may also be implemented—in whole or in part—with instructions embodied in memory formatted to be executed by one or more general and/or application-specific processors.

In one embodiment, the drive controller 210 may include a processor 230, a buffer manager 235, and a media controller 240. The drive controller 210 may process, via processor 230, read and write requests in conjunction with the host interface logic 220, the interface between the apparatus 205 and the host of apparatus 205 (e.g., an operating system, host hardware system, etc.). The driver buffer 215 may hold data temporarily for internal operations of apparatus 205. For example, a host may send data to apparatus 205 with a request to store the data on the drive media 225. The driver controller 210 may process the request and store the received data in the drive media 225. In some cases, a portion of data stored in the drive media 225 may be copied to the drive buffer 215 and the processor 230 may process or modify this copy of data and/or perform an operation in relation to this copy of data held temporarily in the drive buffer 215.

In one embodiment, the drive media 225 may include flash memory 250 and sense amplifier 260. Flash memory 250 may include an array of transistor flash memory cells. In some configurations, sense amplifier 260 may sense whether a bit line of a memory cell within flash memory 250 conducts when a read voltage is applied. Sense amplifier 260 may include leakage current detector 265 and clock counter 270. Sense amplifier may use leakage current detector 265 to measure a level of current leaking from a bit line when applying a read voltage to the bit line. Sense amplifier 260 may use clock counter 270 to measure a time it takes to sense whether the bit line conducts when the read voltage is applied.

Although depicted outside of drive controller 210, in some embodiments, soft data module 130-a may include software, firmware, and/or hardware located within drive controller 210 and/or drive media 225. For example, soft data module 130-a may include at least portions of processor 230, buffer manager 235, and/or media controller 240. In one example, soft data module 130-a may include one or more instructions executed by processor 230, buffer manager 235, and/or media controller 240.

Additionally, or alternatively, soft data module 130-a may include at least portions of sense amplifier 260, leakage current detector 265, and/or clock counter 270. In one example, soft data module 130-a may include one or more instructions executed by sense amplifier 260, leakage current detector 265, and/or clock counter 270. The soft data module 130-a may be configured to assign an LLR value to a memory cell and using the LLR value as a soft LDPC input to an ECC engine to decode the data stored in the memory cell.

Figure 3:
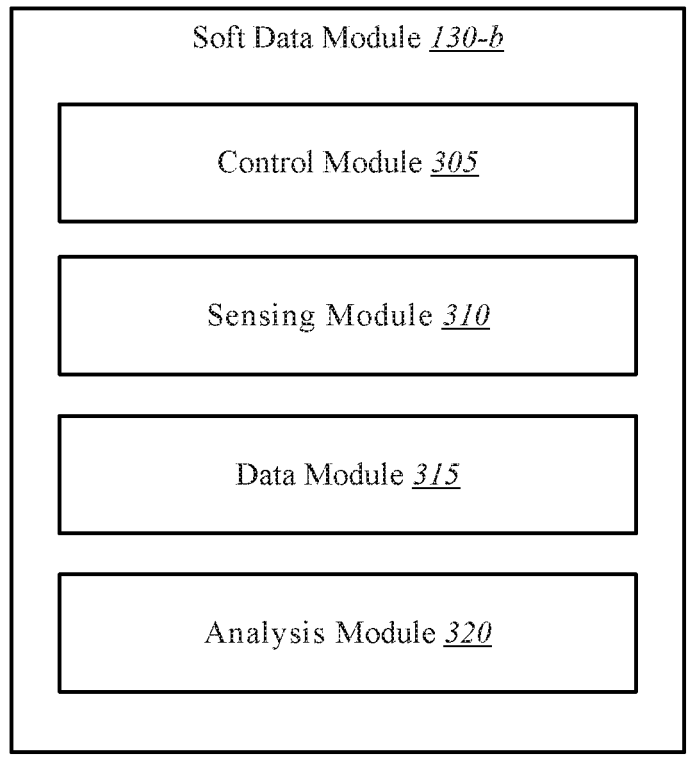
FIG. 3 shows a block diagram of a device in accordance with various aspects of this disclosure.

FIG. 3 shows a block diagram 300 of a soft data module 130-*b*. The soft data module 130-*b* may include one or more processors, memory, and/or one or more storage devices. The soft data module 130-*b* may include control module 305, sensing module 310, data module 315, and analysis module 320. The soft data module 130-*b* may be one example of soft data module 130 of FIGS. 1 and/or 2. Each of these components may be in communication with each other.

The soft data module 130 may perform one or more functions in conjunction with a sense amplifier and a flash memory core. For example, soft data module 130 may perform one or more functions in conjunction with a sense amplifier of a NAND flash memory core (e.g., a flash memory core of flash memory 250 from FIG. 2). Additionally, or alternatively, soft data module 130 may perform one or more functions in conjunction with a processor. For example, soft data module 130 may perform on or more functions in conjunction with a storage controller of a flash memory device (e.g., drive controller 210 of FIG. 2). In some cases, the soft data module 130 may perform one or more functions in conjunction with a clock counter (e.g., clock counter 270 of FIG. 2). For example, the sense amplifier of a NAND flash memory core may include a clock counter for measuring sensing time and/or other timing data associated with reading a bit line of a memory cell.

In one embodiment, read operation control module 305 may select a page of memory cells and apply a first read voltage to a word line of the selected page of memory cells. In some cases, control module 305 may apply a pass voltage to word lines associated with one or more different pages of memory cells of the memory block other than the selected page of memory cells. In some cases, control module 305 may select a bit line of a memory cell within the selected page. Upon the control module 305 applying the first read voltage to the selected bit line, sensing module 310 may sense whether the selected bit line of the memory cell in the selected page conducts. Upon determining the bit line of the memory cell conducts, data module 315 may identify the memory cell as storing a logical 1. On the other hand, upon determining the bit line of the memory cell in the selected page does not conduct, data module 315 may identify the memory cell as storing a logical 0.

In some embodiments, sensing module 310 may measure a side effect associated with sensing whether the bit line of the memory cell in the selected page conducts. For example, sensing module 310 may measure a leakage current and/or a sensing time associated with sensing whether the bit line of the memory cell in the selected page conducts. In some embodiments, based at least in part on the measured side effect, data module 315 may assign an LLR value to the memory cell as a soft LDPC input to an ECC decoding of the data associated with one or more memory cells of the selected page. Thus, depending on the measured side effect, an LLR value may be assigned to the memory cell and the assigned LLR value may be used as an input to a soft LDPC ECC engine to decode the data stored in the memory cell.

In one embodiment, data module 315 may send first and second datasets to a processor of a flash memory device. The first and second datasets may contain one or more bits of information each. For example, the first or second dataset may include a single bit such as a logical 0 or a logical 1. In some cases, the data module 315 may send the first and second datasets from a sense amplifier of the flash memory device to a storage controller of the flash memory device. In some cases, data module 315 may operate in conjunction with a processor and/or storage controller of a flash memory device. In some cases, the first dataset may relate to whether the bit line of the memory cell conducts. For example, the first dataset may include a logical 0 to indicate the memory cell stores a logical 0 or a logical 1 to indicate the memory cell stores a logical 1. In some embodiments, the second dataset may relate to the measured side effect.

In one embodiment, the measured side effect may include a leakage current level. For example, the sensing module 310 may measure a level of current leaking from the memory cell during a read operation (e.g., while applying a read voltage and sensing whether the bit line conducts). The leakage current may be measured in amperes, milliamperes, microamperes, nanoamperes, etc. Upon determining the first dataset indicates the memory cell does not conduct (i.e., the memory cell stores a logical 0), analysis module 320 may analyze the leakage current level included in the second dataset to determine whether the leakage current level indicates the memory cell stores a strong logical 0 or a weak logical 0. In some embodiments, analysis module 320 may compare the leakage current level to a predetermined leakage threshold to determine whether the leakage current level satisfies the predetermined leakage threshold. Upon determining the leakage current level satisfies the predetermined leakage threshold, data module 315 may identify the logical 0 stored in the memory cell as a strong logical 0. As a result, data module 315 may assign a strong logical 0 LLR value to the memory cell. On the other hand, upon determining the leakage current level fails to satisfy the predetermined leakage threshold, data module 315 may identify the logical 0 stored in the memory cell as a weak logical 0 and as a result assign a weak logical 0 LLR value to the memory cell. In either case, data module 315 may use the assigned LLR value as an input to a soft LDPC ECC decoding process. For example, the data module 315 may determine LLR values to assign to a weak logical 0, a strong logical 0, a weak logical 1, and a strong logical 1. As an example, data module 315 may assign a LLR value of (+1) to a weak logical 0, a LLR value of (+7) to a strong logical 0, a LLR value of (−1) to a weak logical 1, and a LLR value of (−7) to a strong logical 1.

In one embodiment, the side effect measured by the sensing module 310 may include a sensing time. For example the sensing time may include a time period it takes for the sensing module 310 to sense whether the memory cell in the selected page conducts. In some embodiments, the sensing module 310 measures both the sensing time and the leakage current while the read voltage is applied to the selected bit line.

Upon determining that the first dataset indicates the memory cell stores a logical 1, analysis module 320 may analyze the sensing time from the second dataset to determine whether the sensing time indicates the memory cell stores a strong logical 1 or a weak logical 1. In some embodiments, analysis module 320 may compare the sensing time to a predetermined timing threshold. Upon determining the sensing time satisfies the predetermined timing threshold, data module 315 may identify the logical 1 stored by the memory cell as a strong logical 1 and as a result assign a strong logical 1 LLR value to the memory cell as a soft LDPC input. On the other hand, upon determining the sensing time fails to satisfy the predetermined timing threshold, data module 315 may identify the logical 1 stored by the memory cell as a weak logical 1 and as a result assign a weak logical 1 LLR value to the memory cell as a soft LDPC input.

In one embodiment, sensing module 310 may bypass applying a second and/or subsequent read voltage to the word line of the selected page after applying the first read voltage. The typical read operation of a flash memory cell involves several read operations. For example, a sense amplifier may apply three separate read voltages to determine whether the bit line of the memory cell conducts. Conversely, the sensing module 310 may apply a single read voltage and determine whether the memory cell stores a weak/strong logical 1 or logical 0 based on a measured side effect of applying the single read voltage. Accordingly, the soft data module 130 may significantly reduce the latency and computational toll of reading memory cells in a flash memory device.

Figure 4:
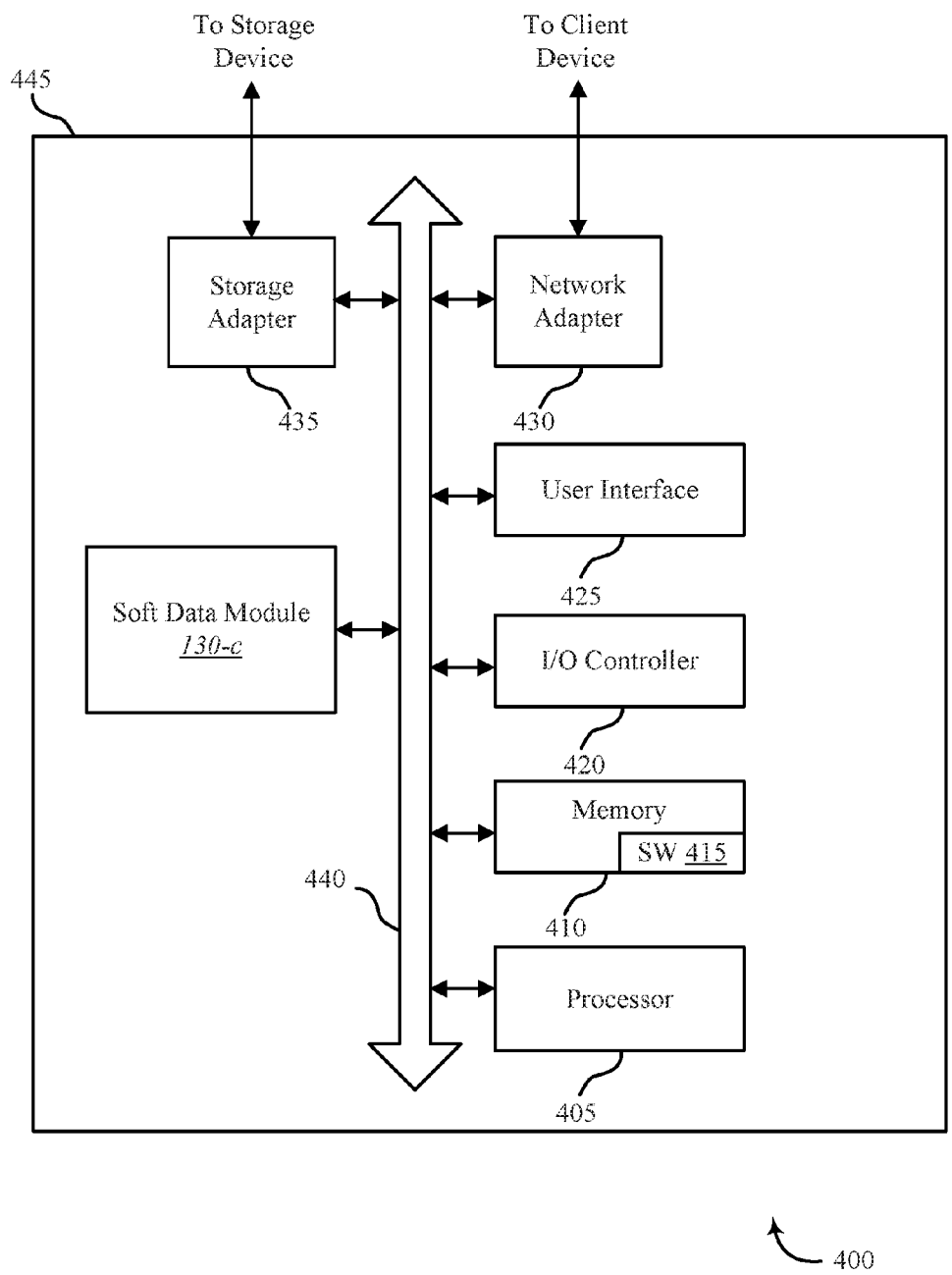
FIG. 4 shows a diagram of a system in accordance with various aspects of this disclosure.

FIG. 4 shows a system 400 for reducing the latency of acquiring soft data from a memory cell based at least in part on a sensing time and/or a leakage current measured while reading the memory cell, in accordance with various examples. System 400 may include an apparatus 445, which may be an example of any one of device 105 and/or 110 of FIG. 1 and/or device 205 of FIG. 2.

Apparatus 445 may include components for bi-directional voice and data communications including components for transmitting communications and components for receiving communications. For example, apparatus 445 may communicate bi-directionally with one or more storage devices and/or client systems. This bi-directional communication may be direct (e.g., apparatus 445 communicating directly with a storage system) and/or indirect (e.g., apparatus 445 communicating indirectly with a client device through a server).

Apparatus 445 may also include a processor module 405, and memory 410 (including software/firmware code (SW) 415), an input/output controller module 420, a user interface module 425, a network adapter 430, and a storage adapter 435. The software/firmware code 415 may be one example of a software application executing on apparatus 445. The network adapter 430 may communicate bi-directionally—via one or more wired links and/or wireless links—with one or more networks and/or client devices. In some embodiments, network adapter 430 may provide a direct connection to a client device via a direct network link to the Internet via a POP (point of presence). In some embodiments, network adapter 430 of apparatus 445 may provide a connection using wireless techniques, including digital cellular telephone connection, Cellular Digital Packet Data (CDPD) connection, digital satellite data connection, and/or another connection. The apparatus 445 may include a soft data module 130-b, which may perform the functions described above for the read verify modules 130 of FIGS. 1, and/or 2.

The signals associated with system 400 may include wireless communication signals such as radio frequency, electromagnetics, local area network (LAN), wide area network (WAN), virtual private network (VPN), wireless network (using 802.11, for example), cellular network (using 3G and/or LTE, for example), and/or other signals. The network adapter 430 may enable one or more of WWAN (GSM, CDMA, and WCDMA), WLAN (including BLUETOOTH® and Wi-Fi), WMAN (WiMAX) for mobile communications, antennas for Wireless Personal Area Network (WPAN) applications (including RFID and UWB), etc.

One or more buses 440 may allow data communication between one or more elements of apparatus 445 (e.g., processor module 405, memory 410, I/O controller module 420, user interface module 425, network adapter 430, and storage adapter 435, etc.).

The memory 410 may include random access memory (RAM), read only memory (ROM), flash RAM, and/or other types. The memory 410 may store computer-readable, computer-executable software/firmware code 415 including instructions that, when executed, cause the processor module 405 to perform various functions described in this disclosure in conjunction with soft data module 130-c. Alternatively, the software/firmware code 415 may not be directly executable by the processor module 405 but may cause a computer (e.g., when compiled and executed) to perform functions described herein. Alternatively, the computer-readable, computer-executable software/firmware code 415 may not be directly executable by the processor module 405, but may be configured to cause a computer (e.g., when compiled and executed) to perform functions described herein. The processor module 405 may include an intelligent hardware device, e.g., a central processing unit (CPU), a microcontroller, an application-specific integrated circuit (ASIC), etc.

In some embodiments, the memory 410 may contain, among other things, the Basic Input-Output system (BIOS) which may control basic hardware and/or software operation such as the interaction with peripheral components or devices. For example, at least a portion of the soft data module 130-b to implement the present systems and methods may be stored within the system memory 410. Applications resident with system 400 are generally stored on and accessed via a non-transitory computer readable medium, such as a hard disk drive or other storage medium. Additionally, applications can be in the form of electronic signals modulated in accordance with the application and data communication technology when accessed via a network interface (e.g., network adapter 430, etc.).

Many other devices and/or subsystems may be connected to one or may be included as one or more elements of system 400 (e.g., personal computing device, mobile computing device, smart phone, server, internet-connected device, cell radio module, and so on). In some embodiments, all of the elements shown in FIG. 4 need not be present to practice the present systems and methods. The devices and subsystems can be interconnected in different ways from that shown in FIG. 4. In some embodiments, an aspect of some operation of a system, such as that shown in FIG. 4, may be readily known in the art and are not discussed in detail in this application. Code to implement the present disclosure can be stored in a non-transitory computer-readable medium such as one or more of system memory 410 or other memory. The operating system provided on I/O controller module 420 may be a mobile device operation system, a desktop/laptop operating system, or another known operating system.

The I/O controller module 420 may operate in conjunction with network adapter 430 and/or storage adapter 435. The network adapter 430 may enable apparatus 445 with the ability to communicate with client devices (e.g., device 105 of FIG. 1), and/or other devices over the network 205 of FIG. 2. Network adapter 430 may provide wired and/or wireless network connections. In some cases, network adapter 430 may include an Ethernet adapter or Fibre Channel adapter. Storage adapter 435 may enable apparatus 445 to access one or more data storage devices (e.g., storage device 110). The one or more data storage devices may include two or more data tiers each. The storage adapter may include one or more of an Ethernet adapter, a Fibre Channel adapter, Fibre Channel Protocol (FCP) adapter, a SCSI adapter, and iSCSI protocol adapter.

Figure 5:
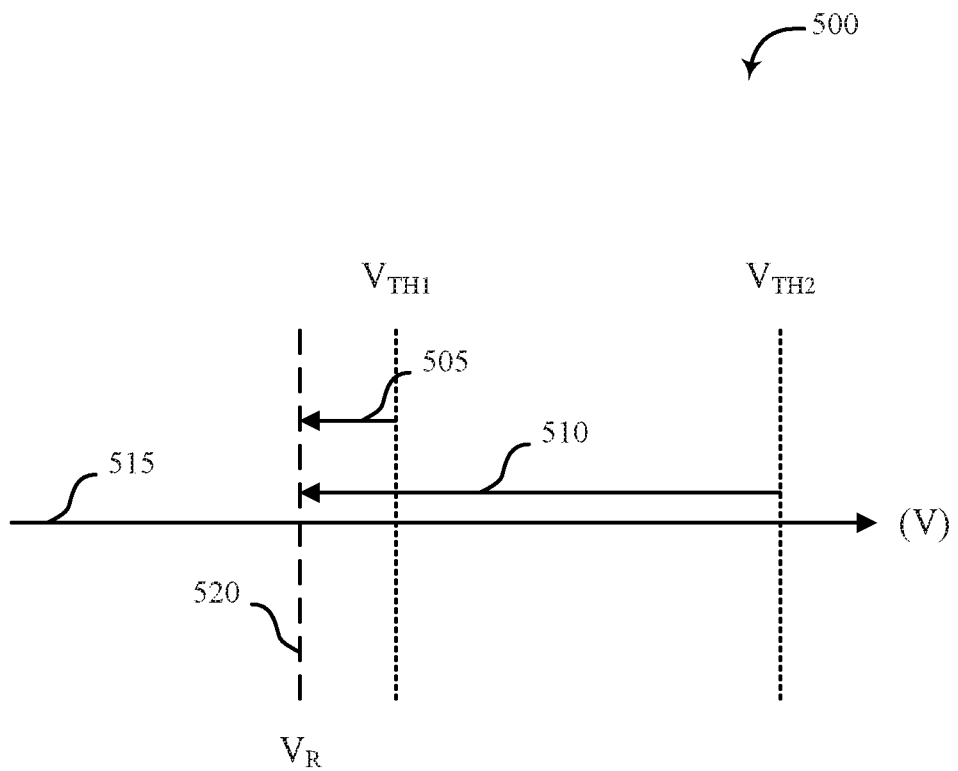
FIG. 5 shows one embodiment of a graph in accordance with various aspects of this disclosure.

FIG. 5 shows a graph 500 for reducing the latency of acquiring soft data from a memory cell based at least in part on a sensing time and/or a leakage current measured while reading the memory cell, in accordance with various examples. At least one aspect of graph 500 may be implemented in conjunction with devices 105 and/or 110 of FIG. 1, apparatus 205 of FIG. 2, and/or soft data module 130 depicted in FIGS. 1, 2, 3, and/or 4.

As depicted, graph 500 the horizontal line 515 represents a voltage level in relation to two depicted voltage thresholds, $V_{TH1}$ and $V_{TH2}$. The voltage threshold, $V_{TH1}$ and $V_{TH2}$, may represent the voltage thresholds of two separate memory cells. For example, $V_{TH1}$ may represent the voltage threshold of a first memory cell and $V_{TH2}$ may represent the voltage threshold of a second memory cell. As depicted, the voltage threshold of the first memory cell, $V_{TH1}$, is a lower voltage than the voltage threshold of the second memory cell, $V_{TH1}$.

In one embodiment, a memory cell storing a logical 0 is charged to store an electrical charge at a given voltage threshold and a memory cell storing a logical 1 holds no charge. Thus, the memory cell holding a logical 0 may be charged with 3 VDC. The threshold of a memory cell charged with 3 VDC may be less than or equal to 3 VDC. For example, the memory cell may be charged with 3 VDC and the threshold voltage may be 2.5 VDC. Alternatively, the memory cell may be charged with 3 VDC and the threshold voltage may be 3 VDC.

In some embodiments, the leakage current may be used when a read of the memory cell indicates the memory cell stores a logical 0 (e.g., the memory cell holds a charge and the bit line does not conduct upon applying the read voltage). Accordingly, as one example, the first and second memory cells associated with the depicted threshold voltages $V_{TH1}$ and $V_{TH2}$ may be charged with a voltage level of a logical 0.

The leakage current level 505 represents the level of current leaking from the first memory cell while a read voltage $V_R$ 520 is applied to the bit line of the first memory cell. Likewise, the leakage current level 510 represents the level of current leaking from the second memory cell while the read voltage $V_R$ 520 is applied to the bit line of the second memory cell. As depicted, the leakage current level 505 is less than the leakage current level 510. Accordingly, in the case of both the first and second memory cells storing a logical 0, the leakage current levels 505 and 510 indicate the strength of the logical 0 stored in each memory cell. Thus, based on the indicated strength of the logical 0 stored in each memory cell indicated by each leakage level, an LLR value may be assigned to each memory cell. As one example, the leakage current level 505 may be measured to be $1 \times 10^{\wedge}-1$ amperes while the leakage current level 510 may be measured to be $1 \times 10^{\wedge}-7$. In one embodiment, the LLR value assigned to each memory cell may be selected based on the measured leakage current. For example, a leakage current of $1 \times 10^{\wedge}-1$ may be assigned an LLR value of +1, while a leakage current of $1 \times 10^{\wedge}-7$ may be assigned an LLR value of +7. Thus, the first memory cell with a leakage current level 505 of $1 \times 10^{\wedge}-1$ amperes may be assigned an LLR of +1, while the second memory cell with a leakage current level 510 of $1 \times 10^{\wedge}-7$ amperes may be assigned an LLR of +7. The assigned LLR values may be used as soft LDPC inputs to an ECC engine to decode the data stored in the memory cells.

Figure 6:
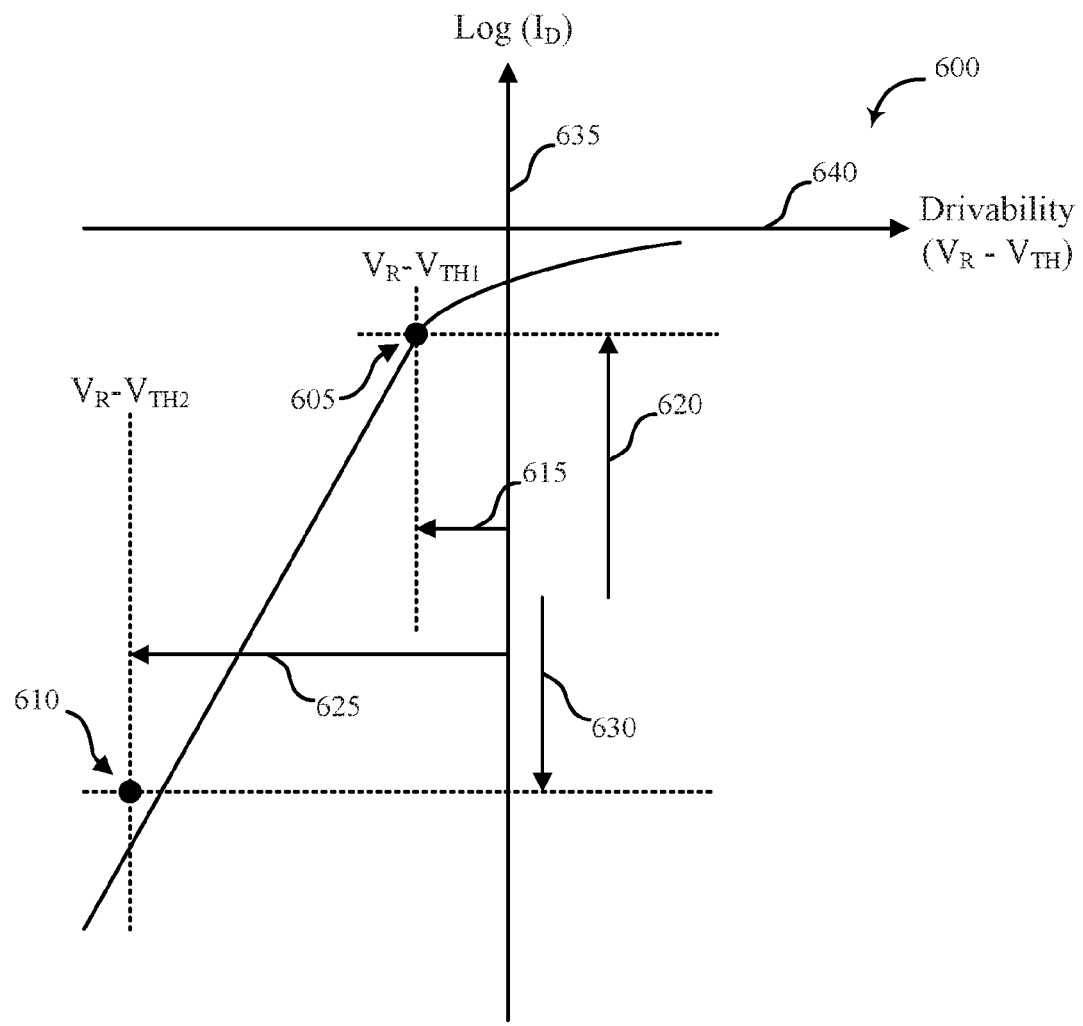
FIG. 6 shows another embodiment of a graph in accordance with various aspects of this disclosure.

FIG. 6 shows a graph 600 for reducing the latency of acquiring soft data from a memory cell based at least in part on a sensing time and/or a leakage current measured while reading the memory cell, in accordance with various examples. Graph 600 may be one exemplary usage of data associated with graph 500 of FIG. 5. At least one aspect of graph 600 may be implemented in conjunction with devices 105 and/or 110 of FIG. 1, apparatus 205 of FIG. 2, and/or soft data module 130 depicted in FIGS. 1, 2, 3, and/or 4.

As depicted, graph 600 may depict the drivability in relation to a measured leakage current ($I_D$) for a given memory cell. In one embodiment, graph 600 may depict a NAND cell transistor current/voltage (I/V) curve. Graph 600 may include a y-axis 635 depicting a logarithmic scale of the measure leakage current (Log $I_D$) and a x-axis 640 depicting a measured drivability. The measured drivability may be based on the difference between a read voltage $V_R$ and a threshold voltage $V_{TH}$ of a measured memory cell ($V_R - V_{TH}$). The I/V value 605 of a first memory cell may be low relative to the second memory cell, as depicted. The I/V value 605 may be determined by finding the difference between the read voltage $V_R$ and the threshold voltage $V_{TH1}$ of the first memory cell ($V_R - V_{TH1}$). The leakage current level of the first memory cell may be measured at $1 \times 10^{\wedge}-1$. Since $Log(1 \times 10^{\wedge}-1)=-1$, the I/V value 605 of the first memory cell is positioned as indicated. On the other hand, the I/V value 610 of the second memory cell may be high relative to the first memory cell, as depicted. The I/V value 610 may be determined by finding the difference between the read voltage $V_R$ and the threshold voltage $V_{TH2}$ of the second memory cell ($V_R - V_{TH2}$). The leakage current level of the second memory cell may be measured at $1 \times 10^{\wedge}-7$. Since $Log(1 \times 10^{\wedge}-7)=-7$, the I/V value 610 of the second memory cell is positioned as indicated.

Figure 7:
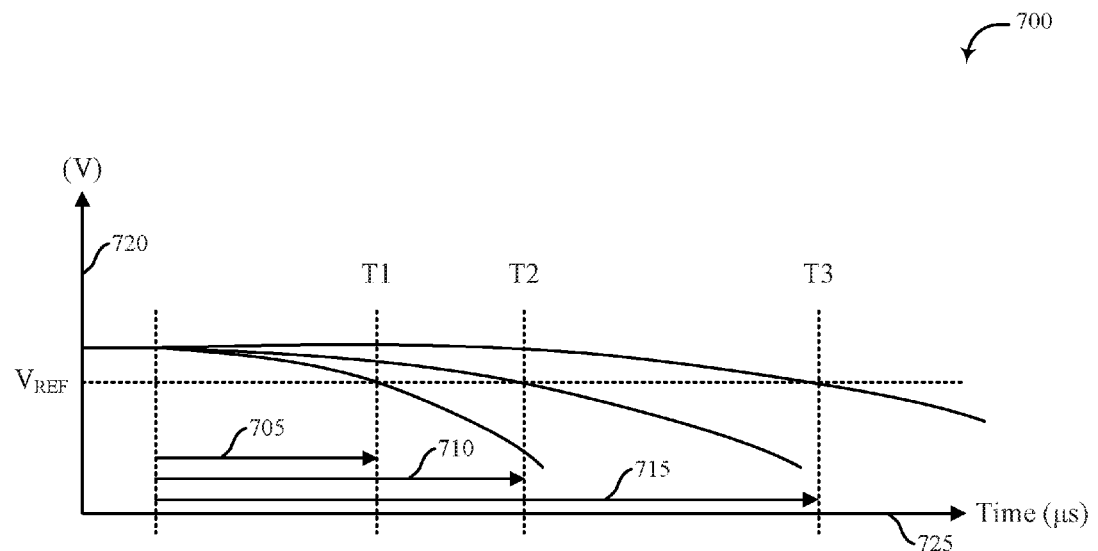
FIG. 7 shows another embodiment of a graph in accordance with various aspects of this disclosure.

FIG. 7 shows a graph 700 for reducing the latency of acquiring soft data from a memory cell based at least in part on a sensing time and/or a leakage current measured while reading the memory cell, in accordance with various examples. At least one aspect of graph 700 may be implemented in conjunction with devices 105 and/or 110 of FIG. 1, apparatus 205 of FIG. 2, and/or soft data module 130 depicted in FIGS. 1, 2, 3, and/or 4.

As depicted, graph 700 depicts a x-y graph based on sensing time measured while reading a memory cell. The y-axis 720 depicts a voltage level (V) and the x-axis 725 depicts measured time (e.g., in microseconds as depicted). At the time of sensing the data of a memory cell, a flash memory core cell opens a bit-line current flow by applying a read voltage $V_R$ on the memory cell and a pass voltage $V_{PASS}$ for all other cells. In some embodiments, the sensing time may be used when a read of the memory cell indicates the memory cell stores a logical 1 (e.g., the bit line conducts upon applying the read voltage). If the memory cell being read has strong logical 1 data, the high current flows and the bit-line voltage drops faster than cells with weak logical 1 data.

As depicted, the graph 700 depicts the sensing time of three memory cells. The first sensing time T1 705 may be associated with a first memory cell, the second sensing time T2 710 with a second memory cell, and the third sensing time T3 715 with a third memory cell. As shown, the first sensing time T1 705 is a shorter sensing time than both the second sensing time T2 710 and the third sensing time T3 715. Accordingly, because the sensing time T1 705 of the first memory cell is relatively short, the first memory cell may be identified as storing a strong logical 1. Likewise, because the sensing time T3 715 of the third memory cell is relatively long, the third memory cell may be identified as storing a weak logical 1. Lastly, because the sensing time T2 710 of the second memory cell is neither relatively short nor relatively long, the second memory cell may be identified as storing a mid-level logical 1.

In one embodiment, LLR values may be assigned to each of the three memory cells based on the measured sensing time. In some embodiments, the LLR values may be assigned based on the negative inverse of the measured sensing time. Thus, as one example, the first sensing time T1 705 may be measured to be $\frac{1}{7}$ µs, the second sensing time T2 710 may be measured to be $\frac{1}{3}$ µs, and the third sensing time T3 715 may be measured to be 1 µs. Accordingly, the first memory cell may be assigned an LLR value of (−7), the second memory cell may be assigned an LLR value of (−3), and the third memory cell may be assigned an LLR value of (−1). Accordingly, the assigned LLR value may be used as soft LDPC inputs to an ECC engine to decode the data stored in the memory cells.

Figure 8:
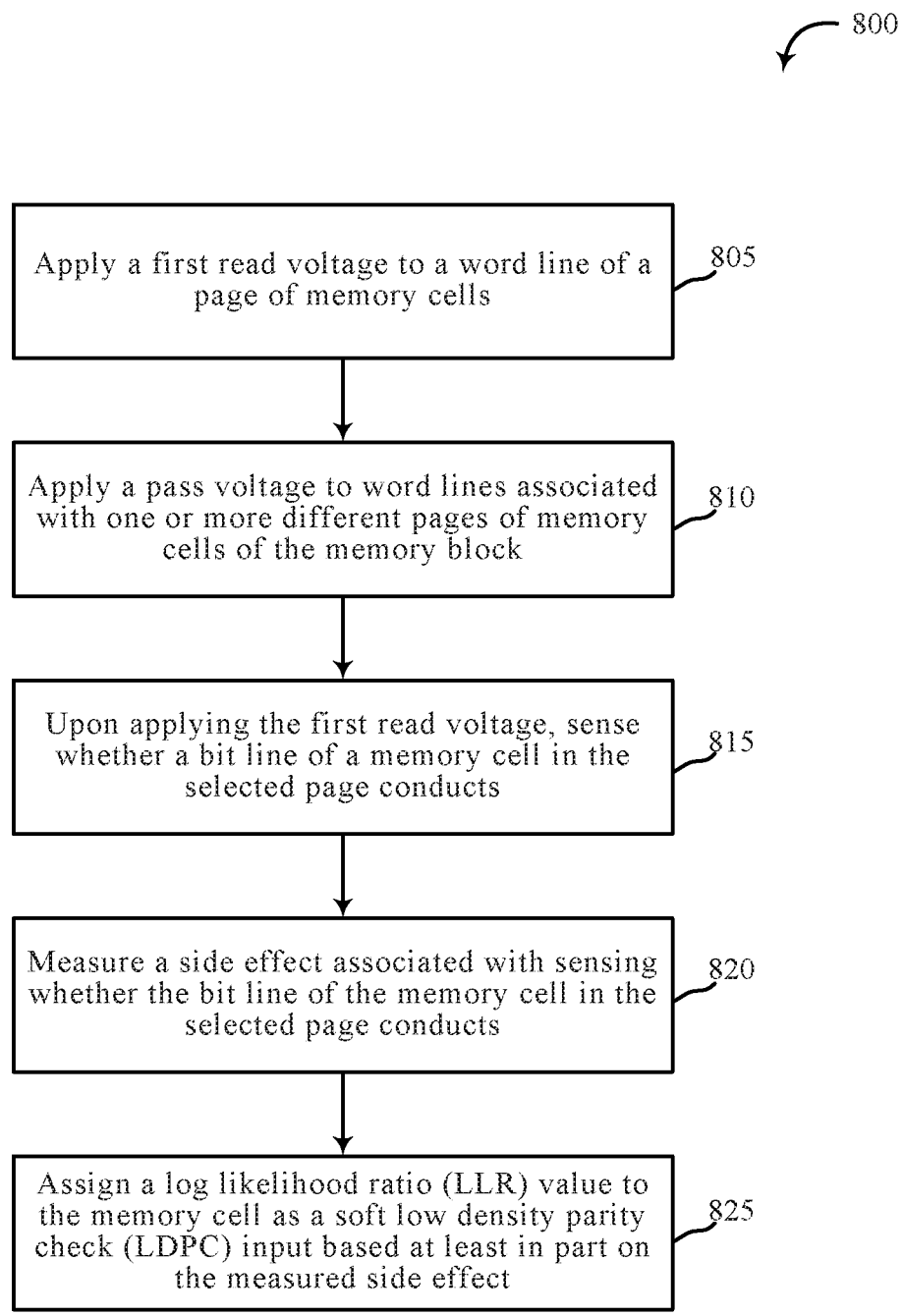
FIG. 8 is a flow chart illustrating an example of a method in accordance with various aspects of this disclosure.

FIG. 8 is a flow chart illustrating an example of a method 800 for reducing the latency of acquiring soft data from a memory cell based at least in part on a sensing time and/or a leakage current measured while reading the memory cell, in accordance with various aspects of the present disclosure. One or more aspects of the method 800 may be implemented in conjunction with devices 105 and/or 110 of FIG. 1, apparatus 205 of FIG. 2, and/or soft data module 130 depicted in FIGS. 1, 2, 3, and/or 4. In some examples, a backend server, computing device, and/or storage device may execute one or more sets of codes to control the functional elements of the backend server, computing device, and/or storage device to perform one or more of the functions described below. Additionally or alternatively, the backend server, computing device, and/or storage device may perform one or more of the functions described below using special-purpose hardware.

At block 805, the method 800 may include applying a read voltage to a word line of a page of memory cells. In some cases, the page of memory cells may be selected by a processor of a flash memory device for a read operation. At block 810, the method 800 may include applying a pass voltage to word lines associated with one or more different pages of memory cells of the memory block. At block 815, upon applying the read voltage, the method 800 may include sensing whether a bit line of a memory cell in the selected page conducts. At block 820, the method 800 may include measuring a side effect associated with sensing whether the bit line of the memory cell in the selected page conducts. At block 825, the method 800 may include assigning a log likelihood ratio (LLR) value to the memory cell as a soft low density parity check (LDPC) input based at least in part on the measured side effect.

The operation(s) at block 805-825 may be performed using the soft data module 130 described with reference to FIGS. 1-4 and/or another module. Thus, the method 800 may provide for reducing the latency of acquiring soft data from a memory cell based at least in part on a sensing time and/or a leakage current measured while reading the memory cell relating to reducing the latency of acquiring soft data from a memory cell based at least in part on a sensing time and/or a leakage current measured while reading the memory cell. It should be noted that the method 800 is just one implementation and that the operations of the method 800 may be rearranged, omitted, and/or otherwise modified such that other implementations are possible and contemplated.

Figure 9:
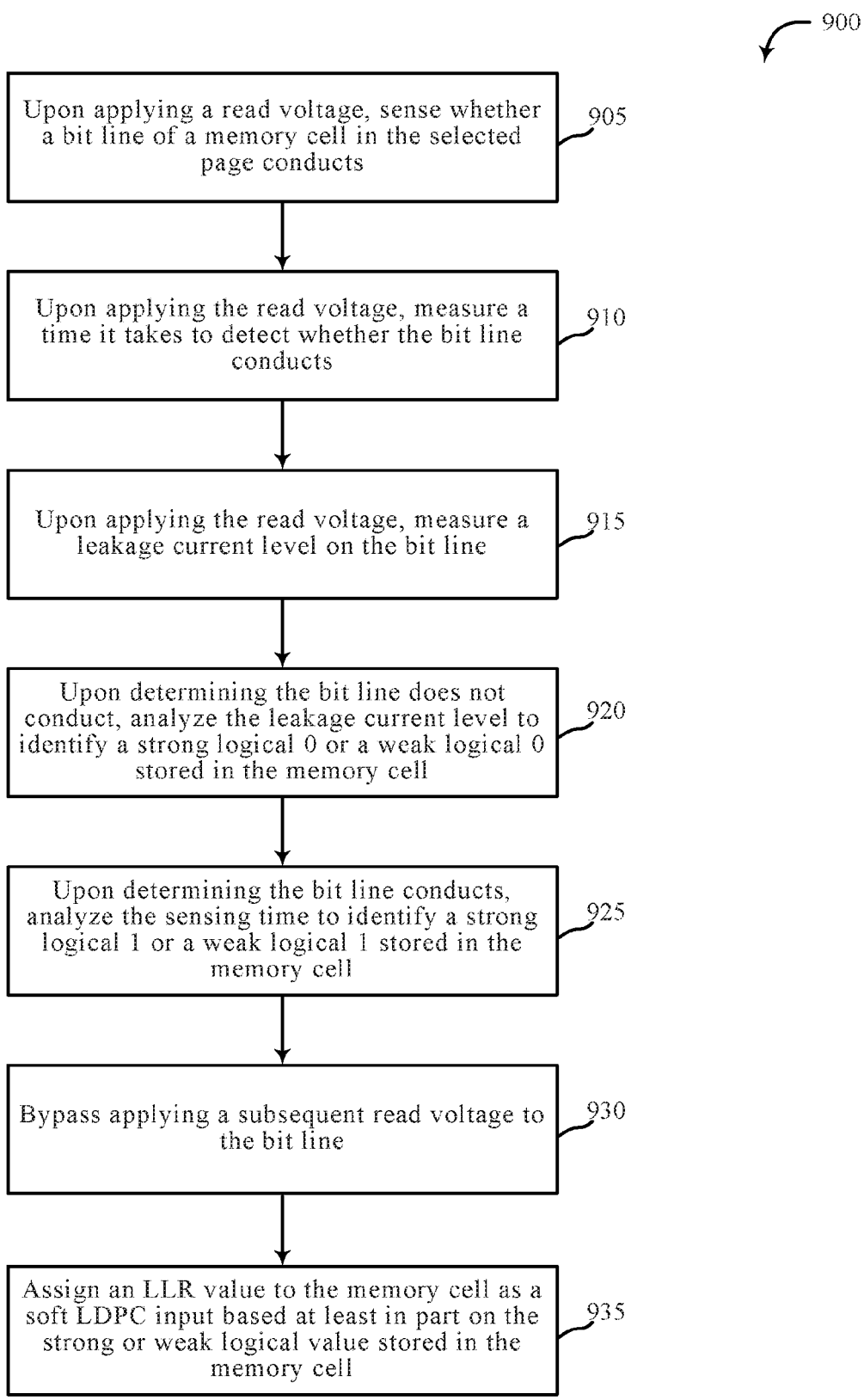
FIG. 9 is a flow chart illustrating an example of a method in accordance with various aspects of this disclosure.

FIG. 9 is a flow chart illustrating an example of a method 900 for reducing the latency of acquiring soft data from a memory cell based at least in part on a sensing time and/or a leakage current measured while reading the memory cell, in accordance with various aspects of the present disclosure. One or more aspects of the method 900 may be implemented in conjunction with devices 105 and/or 110 of FIG. 1, apparatus 205 of FIG. 2, and/or soft data module 130 depicted in FIGS. 1, 2, 3, and/or 4. In some examples, a backend server, computing device, and/or storage device may execute one or more sets of codes to control the functional elements of the backend server, computing device, and/or storage device to perform one or more of the functions described below. Additionally or alternatively, the backend server, computing device, and/or storage device may perform one or more of the functions described below using special-purpose hardware.

At block 905, upon applying a first read voltage, the method 900 may include sensing whether a bit line of a memory cell in the selected page conducts. In some embodiments, upon determining the bit line of the memory cell in the selected page conducts, the method 900 includes identifying the memory cell as storing a logical 1, and upon determining the bit line of the memory cell in the selected page does not conduct, the method 900 includes identifying the memory cell as storing a logical 0. At block 910, upon applying the first read voltage, the method 900 may include measuring a time it takes to detect whether the bit line conducts. This measured time may be referred to as a sensing time. At block 915, upon applying the first read voltage, the method 900 may include measuring a leakage current on the bit line. The measuring of the sensing time and/or leakage current may occur while the first read voltage is being applied. The measuring of the sending time may occur simultaneously and/or sequentially with relation to the measuring of the leakage current. At block 920, upon determining the bit line does not conduct, the method 900 may include analyzing the leakage current level to identify a strong logical 0 or a weak logical 0 stored in the memory cell. In some embodiments, the method 900 may include comparing the leakage current level to a predetermined leakage threshold. Upon determining the leakage current level satisfies the predetermined leakage threshold, the method 900 may include assigning a strong logical 0 LLR value to the memory cell, upon determining the leakage current level fails to satisfy the predetermined leakage threshold, the method 900 may include assigning a weak logical 0 LLR value to the memory cell. At block 925, upon determining the bit line conducts, the method 900 may include analyzing the sensing time to identify a strong logical 1 or a weak logical 1 stored in the memory cell. At block 930, the method 900 may include bypassing applying a second read voltage to the bit line after applying the first read voltage. At block 935, the method 900 may include assigning a LLR value to the memory cell as an LDPC input based at least in part on the strong or weak logical value stored in the memory cell.

The operations at blocks 905-935 may be performed using the soft data module 130 described with reference to FIGS. 1-4 and/or another module. Thus, the method 900 may provide for reducing the latency of acquiring soft data from a memory cell based at least in part on a sensing time and/or a leakage current measured while reading the memory cell relating to reducing the latency of acquiring soft data from a memory cell based at least in part on a sensing time and/or a leakage current measured while reading the memory cell. It should be noted that the method 900 is just one implementation and that the operations of the method 900 may be rearranged, omitted, and/or otherwise modified such that other implementations are possible and contemplated.

In some examples, aspects from two or more of the methods 800 and 900 may be combined and/or separated. It should be noted that the methods 800 and 900 are just example implementations, and that the operations of the methods 800 and 900 may be rearranged or otherwise modified such that other implementations are possible.

The detailed description set forth above in connection with the appended drawings describes examples and does not represent the only instances that may be implemented or that are within the scope of the claims. The terms "example" and "exemplary," when used in this description, mean "serving as an example, instance, or illustration," and not "preferred" or "advantageous over other examples." The detailed description includes specific details for the purpose of providing an understanding of the described techniques. These techniques, however, may be practiced without these specific details. In some instances, known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with this disclosure may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, and/or state machine. A processor may also be implemented as a combination of computing devices, e.g., a combination of a DSP and a microprocessor, multiple microprocessors, one or more microprocessors in conjunction with a DSP core, and/or any other such configuration.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (i.e., A and B and C).

In addition, any disclosure of components contained within other components or separate from other components should be considered exemplary because multiple other architectures may potentially be implemented to achieve the same functionality, including incorporating all, most, and/or some elements as part of one or more unitary structures and/or separate structures.

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, flash memory, CD-ROM, DVD, or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed.

This disclosure may specifically apply to security system applications. This disclosure may specifically apply to storage system applications. In some embodiments, the concepts, the technical descriptions, the features, the methods, the ideas, and/or the descriptions may specifically apply to storage and/or data security system applications. Distinct advantages of such systems for these specific applications are apparent from this disclosure.

The process parameters, actions, and steps described and/or illustrated in this disclosure are given by way of example only and can be varied as desired. For example, while the steps illustrated and/or described may be shown or discussed in a particular order, these steps do not necessarily need to be performed in the order illustrated or discussed. The various exemplary methods described and/or illustrated here may also omit one or more of the steps described or illustrated here or include additional steps in addition to those disclosed.

Furthermore, while various embodiments have been described and/or illustrated here in the context of fully functional computing systems, one or more of these exemplary embodiments may be distributed as a program product in a variety of forms, regardless of the particular type of computer-readable media used to actually carry out the distribution. The embodiments disclosed herein may also be implemented using software modules that perform certain

What is claimed is:

1. A storage device, comprising:
a sensing amplifier and a processor;
the sensing amplifier to apply a first read voltage to a word line of a page of memory cells, the page of memory cells being selected by the processor;
upon applying the first read voltage, the sensing amplifier to sense whether a bit line of a memory cell in the selected page conducts;
the sensing amplifier to measure a side effect associated with sensing whether the bit line of the memory cell in the selected page conducts, and to bypass applying a second read voltage to the word line based at least in part on the measured side effect.

2. The storage device of claim 1, comprising:
the processor to assign a log likelihood ratio (LLR) value to the memory cell as a soft low density parity check (LDPC) input based at least in part on the sensing amplifier applying the first read voltage and on the measured side effect.

3. The storage device of claim 1, comprising:
upon determining the bit line of the memory cell in the selected page conducts, the sensing amplifier to identify the memory cell as storing a logical 1; and
upon determining the bit line of the memory cell in the selected page does not conduct, the sensing amplifier to identify the memory cell as storing a logical 0.

4. The storage device of claim 3, comprising:
the sensing amplifier to send to the processor first data related to whether the bit line of the memory cell conducts and second data related to the measured side effect.

5. The storage device of claim 4, comprising:
wherein the measured side effect comprises a leakage current level; and
upon determining the first data indicates the memory cell stores a logical 0, the processor to analyze the leakage current level from the second data to determine whether the leakage current level indicates the memory cell stores a strong logical 0 or a weak logical 0.

6. The storage device of claim 5, comprising:
the processor to compare the leakage current level to a predetermined leakage threshold.

7. The storage device of claim 6, comprising:
upon determining the leakage current level satisfies the predetermined leakage threshold, the processor to assign a strong logical 0 LLR value to the memory cell; and
upon determining the leakage current level fails to satisfy the predetermined leakage threshold, the processor to assign a weak logical 0 LLR value to the memory cell.

8. The storage device of claim 4, comprising:
wherein the measured side effect comprises a sensing time, the sensing time comprising a time period it takes for the sensing amplifier to determine whether the memory cell in the selected page conducts; and
upon determining the first data indicates the memory cell stores a logical 1, the processor to analyze the sensing time from the second data to determine whether the sensing time indicates the memory cell stores a strong logical 1 or a weak logical 1.

9. The storage device of claim 8, comprising:
the processor to compare the sensing time to a predetermined timing threshold.

10. The storage device of claim 1, comprising:
upon determining the sensing time satisfies the predetermined timing threshold, the processor to assign a strong logical 1 LLR value to the memory cell; and
upon determining the sensing time fails to satisfy the predetermined timing threshold, the processor to assign a weak logical 1 LLR value to the memory cell.

11. The storage device of claim 1, the sense amplifier to:
apply a pass voltage to word lines associated with one or more different pages of memory cells; and
bypass applying a second read voltage to the word line of the selected page in relation to determining whether the memory cell in the selected page conducts.

12. A method for fast soft data reading, comprising:
applying a first read voltage to a word line of a page of memory cells, the page of memory cells being selected by a processor of a flash memory device for a read operation;
upon applying the first read voltage, sensing whether a bit line of a memory cell in the selected page conducts;
measuring a side effect associated with sensing whether the bit line of the memory cell in the selected page conducts; and
bypassing applying a second read voltage to the word line based on the measured side effect.

13. The method of claim 12, comprising:
applying a pass voltage to word lines associated with one or more different pages of memory cells of a memory block.

14. The method of claim 12, comprising:
assigning a log likelihood ratio (LLR) value to the memory cell as a soft low density parity check (LDPC) input based at least in part on the applying the first read voltage and on the measured side effect.

15. The method of claim 12, comprising:
upon determining the bit line of the memory cell in the selected page conducts, identifying the memory cell as storing a logical 1; and
upon determining the bit line of the memory cell in the selected page does not conduct, identifying the memory cell as storing a logical 0.

16. The method of claim 15, comprising:
sending, from a sense amplifier to the processor of the flash memory device, first data related to whether the bit line of the memory cell conducts and second data related to the measured side effect.

17. The method of claim 16, comprising:
wherein the measured side effect comprises a leakage current level; and
upon determining the first data indicates the memory cell stores a logical 0, analyzing the leakage current level from the second data to determine whether the leakage current level indicates the memory cell stores a strong logical 0 or a weak logical 0.

18. The method of claim 17, comprising:
assigning a log likelihood ratio (LLR) value to the memory cell as a soft low density parity check (LDPC) input based at least in part on the applying the first read voltage and on the measured side effect;
comparing the leakage current level to a predetermined leakage threshold;
upon determining the leakage current level satisfies the predetermined leakage threshold, assigning a strong logical 0 LLR value to the memory cell; and
upon determining the leakage current level fails to satisfy the predetermined leakage threshold, assigning a weak logical 0 LLR value to the memory cell.

19. The method of claim 16, comprising:
wherein the measured side effect comprises a sensing time, the sensing time comprising a time period it takes for the sense amplifier to determine whether the memory cell in the selected page conducts; and
upon determining the first data indicates the memory cell stores a logical 1, analyzing the sensing time from the second data to determine whether the sensing time indicates the memory cell stores a strong logical 1 or a weak logical 1.

20. A computing device configured for fast soft data reading, comprising:
a processor;
memory in electronic communication with the processor, the memory stores computer executable instructions that when executed by the processor cause the processor to perform the steps of:
applying a first read voltage to a word line of a page of memory cells, the page of memory cells being selected by the processor for a read operation;
upon applying the first read voltage, sensing whether a bit line of a memory cell in the selected page conducts;
measuring a side effect associated with sensing whether the bit line of the memory cell in the selected page conducts; and
bypassing applying a second read voltage to the word line based on the measured side effect.

* * * * *